(12) United States Patent
Boldt et al.

(10) Patent No.: US 7,460,032 B2
(45) Date of Patent: Dec. 2, 2008

(54) METHODS AND APPARATUS FOR PERFORMING ADAPTIVE COMPRESSION

(75) Inventors: Timothy J. Boldt, Mississauga (CA); Andre G. Lewitzky, Waterdown (CA)

(73) Assignee: Evault, Inc., Emeryville, CA (US)

( * ) Notice: Subject to any disclaimer, the term of this patent is extended or adjusted under 35 U.S.C. 154(b) by 0 days.

(21) Appl. No.: 11/542,892

(22) Filed: Oct. 3, 2006

(65) Prior Publication Data

US 2007/0096954 A1    May 3, 2007

Related U.S. Application Data

(60) Provisional application No. 60/731,461, filed on Oct. 27, 2005.

(51) Int. Cl.
*H03M 7/00* (2006.01)

(52) U.S. Cl. .......................................... 341/50; 341/51

(58) Field of Classification Search .................. 341/50, 341/87, 51; 707/101; 725/150; 375/240; 710/33, 72
See application file for complete search history.

(56) References Cited

U.S. PATENT DOCUMENTS

| | | | |
|---|---|---|---|
| 4,929,946 A | 5/1990 | O'Brien | 341/51 |
| 5,801,649 A * | 9/1998 | Fredrickson | 341/58 |
| 6,055,273 A * | 4/2000 | Isomura | 375/240 |
| 6,300,888 B1 * | 10/2001 | Chen et al. | 341/63 |
| 6,362,753 B1 * | 3/2002 | Kasahara | 341/50 |
| 6,624,761 B2 * | 9/2003 | Fallon | 341/51 |
| 2006/0195464 A1 * | 8/2006 | Guo | 707/101 |

* cited by examiner

*Primary Examiner*—Peguy JeanPierre
(74) *Attorney, Agent, or Firm*—Weaver Austin Villeneuve & Sampson LLP

(57) ABSTRACT

Methods and apparatus for performing adaptive compression are disclosed. A data stream is divided into a plurality of data segments. When one of the plurality of data segments is compressed, it is determined whether the compression has been successful. When the compression has been successful, a data segment in proximity to the compressed segment (e.g., the next data segment in the plurality of data segments) is compressed. However, when the compression has been unsuccessful, one or more of the plurality of data segments are skipped (i.e., not compressed) before compression is attempted on another one of the plurality of data segments. When a data segment is compressed, the compression algorithm (and any associated parameter(s)) that is applied is selected based upon a variety of factors, such as the length of the data segment, CPU speed, CPU availability, and/or data throughput such as the network bandwidth or network availability (e.g., where data is to be transmitted via a network interface). The compression algorithm (and any associated parameter(s)) may also be selected, at least in part, based upon a set of user preferences that indicate a preference between the speed with which compression is performed and the amount that a data segment is compressed.

44 Claims, 10 Drawing Sheets

| Index = Data throughput/ Network capacity (e.g., indicating congestion) 502 | Desired compression % 504 | Algorithm and associated parameter(s) 506 |
|---|---|---|
| 0 | 80 | ZLIB(9) |
| 50 | 60 | ZLIB(4) |
| 70 | 30 | LZW |
| 100 | 0 | No compression |

*FIG. 5*

METHODS AND APPARATUS FOR PERFORMING ADAPTIVE COMPRESSION

RELATED APPLICATIONS

This application claims priority from Provisional Application No. 60/731,461, entitled "METHODS AND APPARATUS FOR PERFORMING ADAPTIVE COMPRESSION," by Boldt et al, filed on Oct. 27, 2005, which is incorporated herein by reference for all purposes.

BACKGROUND OF THE INVENTION

The present invention relates to data compression. More particularly, the present invention relates to performing adaptive compression on individual data segments of a data stream.

When data is stored to a local or remotely located storage medium, the data is often compressed. There are a variety of compression algorithms that may be applied to the data. However, different compression algorithms have widely varying results depending upon the type of data being compressed. Even within a file, individual data blocks may exhibit different characteristics and may compress differently when the same compression algorithm is applied to the data segments.

Adaptive data compression has been performed to apply different compression algorithms to individual data segments of a file. For instance, U.S. Pat. No. 4,929,946, entitled "Adaptive data compression apparatus including run length encoding for a tape drive system," issued May 29, 1990 to O'Brien, et al, which is incorporated herein by reference for all purposes, discloses such a system. Such systems generally consider the type of data being compressed. However, there are a variety of other factors that can affect the compression task that such standard approaches to adaptive data compression do not consider.

In view of the above, it would be beneficial if an adaptive compression system could be improved to increase the efficiency with which data is compressed.

SUMMARY OF THE INVENTION

Methods and apparatus for performing adaptive compression are disclosed. Each data segment of a data stream is processed separately. In this manner, individual data segments may be compressed, as appropriate.

In accordance with one embodiment of the invention, a compression method may perform one or both of two different operations on a stream of data. These two operations include 1) compression of data segments in the data stream based upon the result of compression of one or more data segments that are in proximity to the data segments being compressed (e.g., based upon the result of compression of one or more previous data segments in the data stream) and 2) the selection of a compression algorithm to be applied based upon system parameters and/or user preferences.

In accordance with one aspect of the invention, compression of data segments is result-based. In other words, the decision as to whether a data segment is compressed is based upon the successfulness of the compression of one or more previous data segments. Specifically, a data stream is divided into a plurality of data segments (i.e., blocks). When a data segment is compressed, it is determined whether the compression has been successful. If the data segment has been successfully compressed, the next data segment in the data stream is also compressed. However, if the compression of the data segment has not been successful, the next data segment is not compressed. More particularly, one or more data segments following the unsuccessfully compressed data segment are skipped (i.e., not compressed) before compression of another data segment in the data stream is attempted.

In accordance with one embodiment, adaptive compression is performed using parallel processing. In order to compress a file, the file is divided into a plurality of segments of data. These segments may then be processed in parallel. For instance, the compression of the segments may be performed in parallel by two or more CPUs. More particularly, the results of the compression of a segment by one CPU may be provided or made available to the other CPUs. Thus, when compression of one of the segments of data by one CPU is unsuccessful, one or more segments of data in proximity to the segment of data that has been unsuccessfully compressed may be skipped by another CPU before applying the compressing step to another one of the segments of data.

In accordance with one embodiment, the number of data segments to be skipped is determined based upon the number of data segments that have been unsuccessfully compressed. More particularly, the data segments that have been unsuccessfully compressed may be consecutive data segments that have not compressed successfully. For instance, the number of data segments that are skipped may be a multiple of the number of consecutive data segments that have not compressed successfully. The multiple may be a whole number or fraction. As one example, where the number of consecutive data segments that have not compressed successfully is three, the number of data segments that are skipped is six when the multiple is two.

In accordance with another embodiment, a compression that is successful is one that results in an amount (e.g., percentage) of compression that meets a particular threshold amount. For instance, when the threshold is 60%, the compression of a particular data segment is deemed successful if the data segment has been compressed at least 60%. In other words, if the size of the data segment is reduced by at least 60%, the compression is deemed successful. If the amount that a data segment has been compressed does not meet the threshold, the compression is deemed unsuccessful.

In accordance with another aspect of the invention, the compression algorithm (and associated parameter(s)) that is applied is selected based upon characteristics of the system (i.e., system parameters) in which compression is performed. For instance, such characteristics may include the CPU speed, CPU availability, and/or data throughput such as network availability or network bandwidth (e.g., where the data is to be transmitted via a network interface across a network). For instance, the network availability and/or network bandwidth may be pertinent when the compressed data is to be transmitted via a network interface. The compression algorithm may also be selected based upon a set of user preferences, which may indicate a preference between the speed with which compression is performed and the amount that a particular data segment is compressed.

In accordance with one embodiment, a set of user preferences is obtained that indicates a preference between the speed with which compression is performed and the amount that a particular data segment is compressed. The set of user preferences may then be used in combination with other criteria such as the network bandwidth and/or network availability to identify the compression algorithm (and associated parameter(s)), as well as the threshold that may be applied.

In accordance with another aspect of the invention, the invention pertains to a system operable to perform and/or initiate any of the disclosed methods. The system includes one or more processors and one or more memories. At least one of the memories and processors are adapted to provide at least some of the above described method operations. In yet a further embodiment, the invention pertains to a computer program product for performing the disclosed methods. The computer program product has at least one tangible computer readable medium and computer program instructions associated with at least one of the computer readable product configured to perform at least some of the above described method operations.

These and other features and advantages of the present invention will be presented in more detail in the following specification of the invention and the accompanying figures, which illustrate by way of example the principles of the invention.

BRIEF DESCRIPTION OF THE DRAWINGS

FIG. 5 is an exemplary table that may be used to identify a compression algorithm and threshold associated with a particular level of network capacity.

DETAILED DESCRIPTION OF SPECIFIC EMBODIMENTS

Figure 1A:
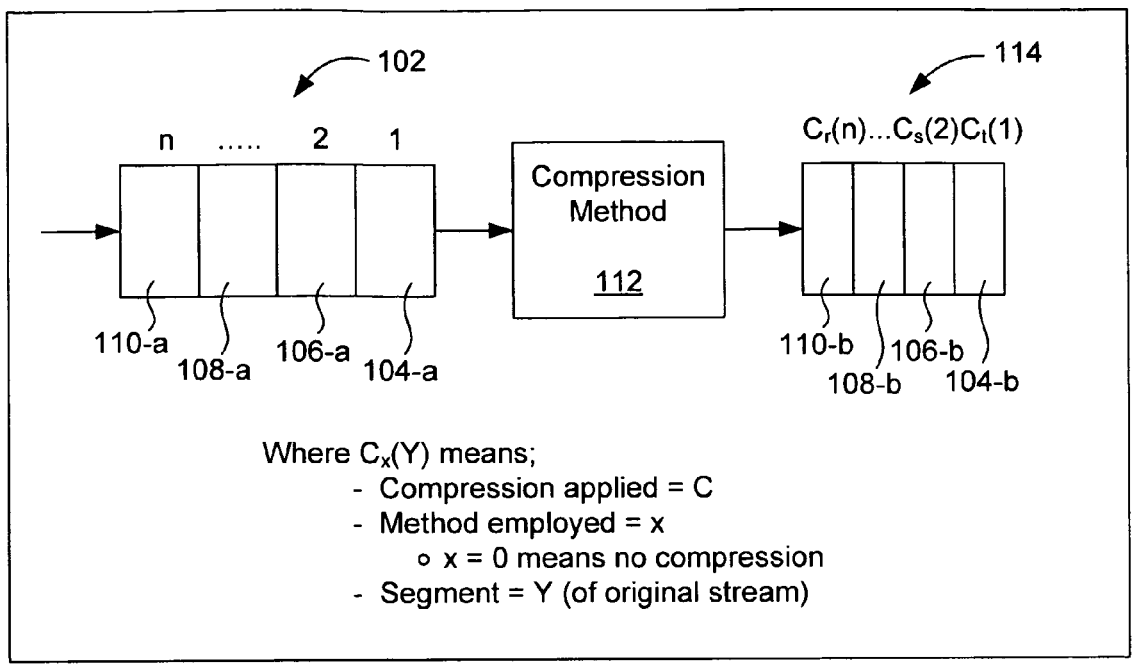
FIG. 1A is an exemplary high-level system block diagram illustrating a data stream generated via performing adaptive compression on individual data segments of a stream of data.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order to avoid unnecessarily obscuring the present invention.

Adaptive data compression is often applied to data streams that are being sent to a local storage medium or a network interface for remote transmission. Existing adaptive compression algorithms and systems are capable of applying different compression algorithms to individual data segments of a file. However, even though many computer systems are capable of running certain compression algorithms that may have better compression results, it can take more time to get those results. This overhead on the computer system may impact other jobs or users of the system. Thus, a variety of factors can affect the efficiency of such systems. These factors can include, for example, CPU availability, CPU speed, and data throughput (e.g., network bandwidth or network availability).

In accordance with one embodiment, the compression algorithm that is applied to a particular segment of data is selected based upon the availability of system resources. For instance, the compression algorithm may be selected based upon CPU availability, CPU speed, and/or data throughput such as the network bandwidth or network availability (e.g., where the compressed data is to be transmitted via a network interface). In other words, the availability of various system resources may be used to determine how aggressive the compression algorithm should be, and an appropriate compression algorithm may be selected on this basis. In the case of transmission of data across a network, if the network bandwidth is limited, more time can be spent compressing data; if the network bandwidth is plentiful, less valuable computer time can be spent compressing the data. The compression algorithm may also be selected based upon a set of user preferences, which may indicate a preference between compression speed and compression amount (e.g., percentage that a particular data segment is compressed).

In some cases, it may be more efficient to not compress one or more data segments within a file because they will not compress significantly enough to warrant the CPU overhead and processing time for the compression operation itself. In accordance with another embodiment, a determination is made as to whether compression of a particular data segment should be performed based upon whether compression of a previous data segment is successful. More particularly, a number of data segments may be skipped based upon the number of incompressible segments encountered in succession before attempting to apply a compression algorithm to another data segment. Thus, it is assumed that if a data segment cannot be compressed successfully, other adjacent data segments within the data stream will not or are not likely to compress successfully. Successfulness of compression may be ascertained by comparing the amount that the previous data segment has been compressed with a threshold (e.g., desired compression amount).

The threshold may be represented in terms of a percentage or fraction, for example, to represent the desired reduction in size of the data segment from its original size. For instance, a threshold of 60% may indicate that in order for compression of a data segment to be successful, its size (e.g., number of bytes) must be reduced by at least 60%. The threshold may be associated with the selected compression algorithm, and therefore may also be selected based upon the CPU availability, CPU speed, and/or data throughput such as network bandwidth or network availability (where the data is to be sent via a network interface for remote transmission). In addition, the threshold may also be selected based upon a set of user preferences, such as those used to select the compression algorithm.

FIG. 1A is an exemplary high-level system block diagram illustrating a data stream generated via performing adaptive compression on individual data segments of a stream of data. Each data stream 102 includes one or more data segments 104-a, 106-a, 108-a, and 110-a. When adaptive compression method 112 receives the data stream 102, the data stream 102 is separated into the individual data segments 104-a, 106-a, 108-a, and 110-a. One or both of two different processes may be applied by the compression method 112. The first process that may be applied determines whether a data segment should be compressed before applying a compression algorithm. The second process that may be applied identifies an appropriate compression algorithm to apply to the data segment.

In accordance with the first process, the adaptive compression method 112 determines whether a data segment should be compressed. This determination may be based upon the successfulness of the compression of prior data segment(s). Successfulness may be defined by a variety of factors, such as the speed of compression or amount of compression. As one example, compression is successful when the compression of a data segment meets a particular threshold (e.g., desired compression amount). In other words, the data segment has been successfully compressed when the data segment has been reduced in size the desired amount. For instance, a threshold may be statically defined or dynamically identified (e.g., in accordance with user preferences or identified in association with a selected compression algorithm and any associated parameter(s)), as will be described in further detail below. In accordance with one embodiment, when compression has been successful, the next data segment will also be compressed. However, when compression has been unsuccessful, one or more data segments that follow the compressed data segment are skipped without compressing those data segments. Various algorithms may be applied to ascertain the number of data segments to be skipped. One such algorithm will be described in further detail below with reference to FIG. 2A.

In accordance with the second process, the adaptive compression method 112 identifies an appropriate compression algorithm to apply to a data segment that is to be compressed. The selected compression algorithm may indicate that no compression is to be performed or, alternatively, may indicate a particular compression algorithm and any associated parameter(s) to be applied. The compression algorithm may be selected based at least in part upon the CPU speed, CPU availability, and/or data throughput (e.g., network bandwidth or network availability). Moreover, the compression algorithm may also be selected at least in part upon a set of user preferences.

User preferences may indicate a preference between compression speed and compression amount. These preferences may include a selection among a plurality of pre-defined user selections. For instance, the user selections may include a fast compression algorithm, moderately fast compression algorithm, and a compression algorithm that offers the maximum compression. Moreover, such user selections may enable a user to select a weighting between compression amount and compression speed. As set forth above, such user selections may be used, at least in part, to select a compression algorithm and/or associated parameter(s) and/or a threshold to be applied during compression.

When the compression method 112 processes a data stream 102, a processed (e.g., compressed) data stream 114 is generated. The processed data stream 114 may then be stored to a storage medium or transmitted via a network interface (e.g., for storage to a remotely located storage medium). As shown, the processed data stream 114 includes data segments 104-b, 106-b, 108-b, and 110-b. Each of these data segments may be compressed or uncompressed. Thus, when the compression method 112 processes the data stream 102, a compression algorithm Cx(Y) may be applied to each data segment Y of the data stream 102, where x denotes the method used to compress the data segment Y. Thus, a different method x may be used to compress each data segment Y. As indicated, the compression method x may indicate that no compression be performed.

Figure 1B:
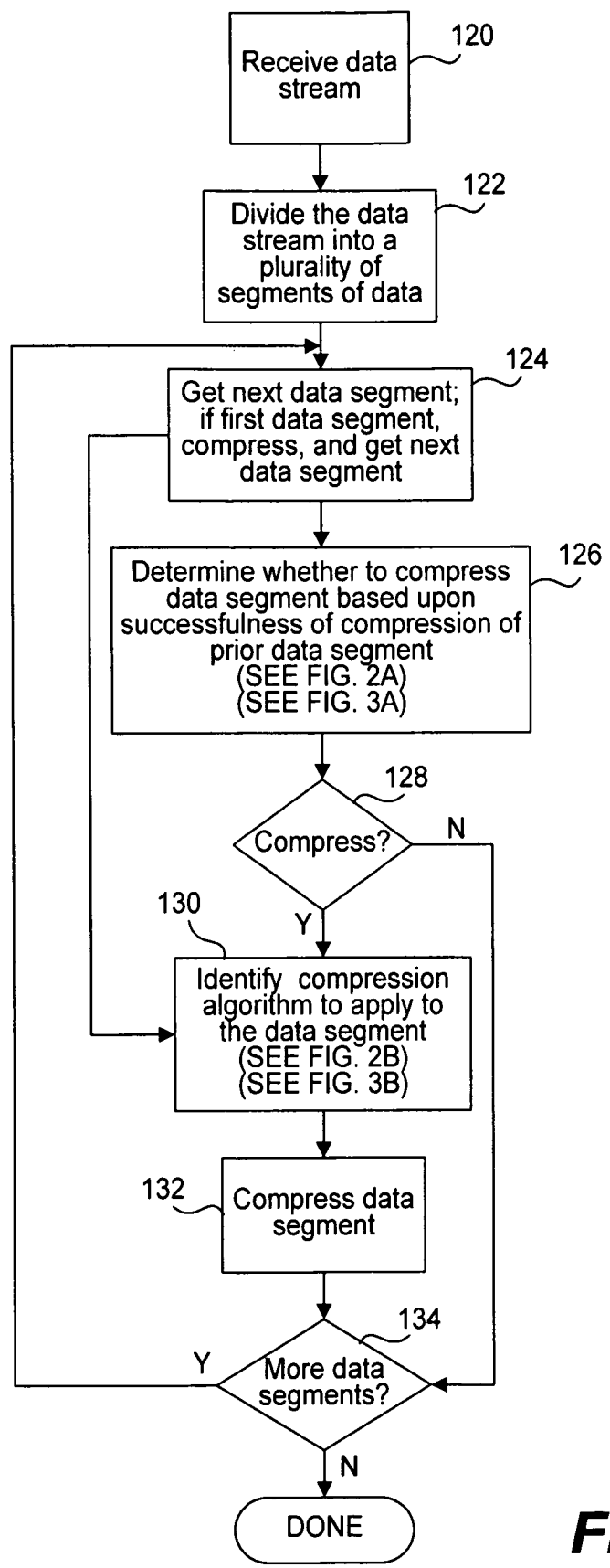
FIG. 1B is a process flow diagram illustrating a simplified method of performing adaptive compression in accordance with one embodiment of the invention.

As set forth above with respect to FIG. 1A, one or both of two different processes may be performed by an adaptive compression method 112. FIG. 1B is a process flow diagram illustrating a simplified method of performing adaptive compression in accordance with one embodiment of the invention. When a data stream is received at 120, the data stream is divided into a plurality of segments of data at 122. For example, the size of the segments of data may be a predetermined size. Thus, the segments of data may be the same length. Alternatively, the data segments may be variable length data segments. A next one of the segments of data is obtained at 124.

The first process that may be performed on a segment of data is determining whether to compress the data segment based upon the successfulness of the compression of the prior segment(s) of data. Thus, if the segment of data obtained at 124 is the first segment of data, the data segment is compressed and a next data segment is obtained. It is then determined whether to compress the next (current) data segment based upon the successfulness of the compression of the prior segment of data at 126. A simplified method of performing compression based upon the outcome of the compression of the data segment(s) preceding the current data segment will be described in further detail below with reference to FIG. 2A. An exemplary method of performing result-based adaptive compression will be described in further detail below with reference to FIG. 3A. If the compression of prior data segment(s) has been successful, the current data segment is compressed. Otherwise, the current data segment is not compressed.

The second process that may be performed on a segment of data is the identification of a compression algorithm to be applied to the segment of data. As shown by the separate execution paths, this second process may be performed separately or in combination with the first process. As shown, if the current data segment is to be compressed 128, a compression algorithm to be applied to the data segment is identified at 130. A simplified method of identifying a compression algorithm to be applied will be described in further detail below with reference to FIG. 2B. An exemplary method of selecting a compression algorithm to be applied will be described in further detail below with reference to FIG. 3B. The data segment is compressed by applying the identified compression algorithm at 132. The process is repeated for all other data segments at 134.

There are a variety of ways in which the two different processes set forth above with respect to FIG. 1B may be implemented. Simplified processes for performing result-based adaptive compression and identifying a compression algorithm will be described in further detail below with reference to FIG. 2A and FIG. 2B, respectively.

Figure 2A:
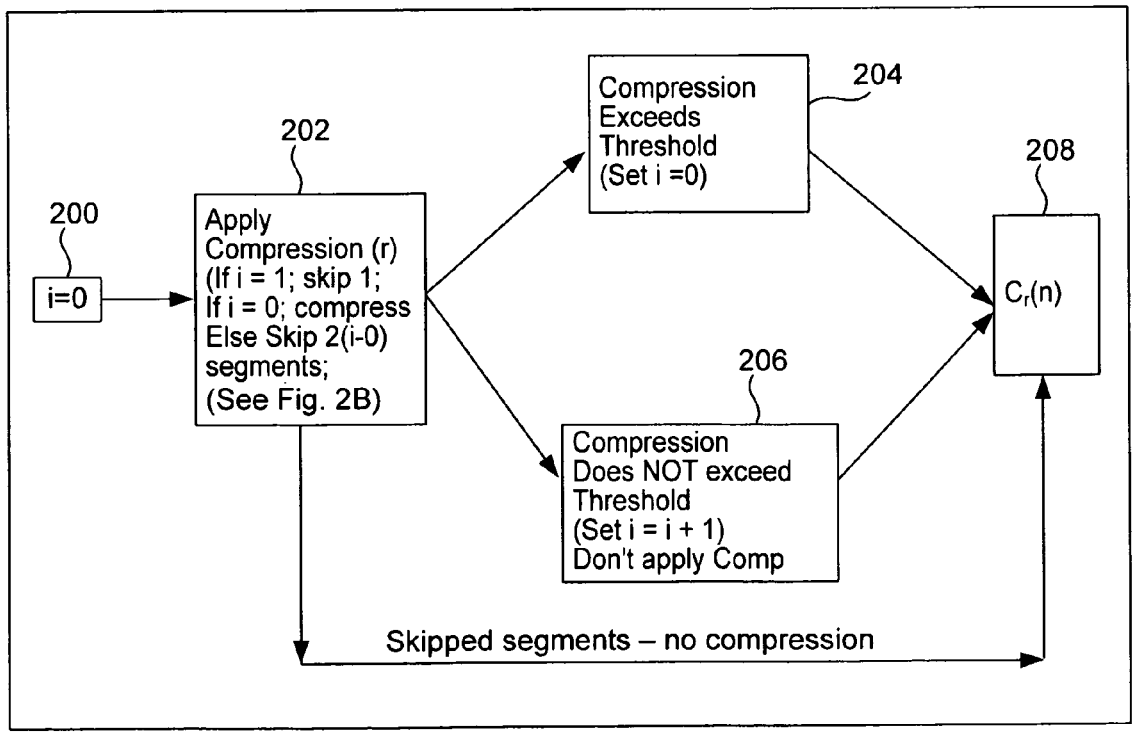
FIG. 2A is a process flow diagram illustrating a simplified method of determining whether compression should be applied to a segment of a data stream based upon the successfulness of compression of a prior segment of data as shown at block 126 of FIG. 1B in accordance with one embodiment of the invention.

In accordance with one embodiment, data segments that are not compressible (or not likely to be compressible) are not compressed, thereby freeing up CPU resources for other tasks. FIG. 2A is a process flow diagram illustrating a simplified method of determining whether compression should be applied to a segment of a data stream based upon the successfulness of compression of prior segment(s) of data as shown at block 126 of FIG. 1B in accordance with one embodiment of the invention. In order to track the number of unsuccessful consecutive compressions, a counter I is initialized at 200. As shown at 202, a compression algorithm is applied to a data segment. A simplified method of identifying a compression algorithm to apply will be described in further detail below with reference to FIG. 2B. If the number of unsuccessful consecutive compressions, I, is equal to one, one data segment is skipped before compressing another data segment. However, if the counter I indicates that there have been no unsuccessful compressions, the next data segment is compressed. If the counter is greater than 1, 2(I−1) data segments are skipped before compressing another data segment.

If the compression amount (e.g., percentage) that the data segment has been compressed exceeds the threshold, the compression is successful as shown at 204. Thus, the counter I is initialized to zero. However, if the compression amount does not exceed the threshold, the compression is unsuccessful as shown at 206. In these instances, the counter I is incremented and compression is not performed. Upon completion of the method, the entire data stream has been processed as shown at 208. As indicated above with reference to FIG. 1A, Cr(n) indicates that each data segment is processed such that it is either compressed or not compressed (e.g., skipped).

As described with reference to FIG. 2A, an algorithm may be applied to determine the number of data segments that are to be skipped. In this example, $2^{(I-1)}$ segments (with a minimum of 1 segment) are skipped. As another example, the number of data segments that are skipped may be a multiple of the number of consecutive data segments that have been unsuccessfully compressed. For instance, the number of data segments that are skipped may be equal to 2* the number of consecutive data segments that have been unsuccessfully compressed. Alternatively, the multiple may be another whole number or fractional number. Thus, the algorithms set forth above are merely illustrative and therefore other mechanisms for determining the number of data segments to skip based upon the result of compression of prior data segment(s) may be applied.

Figure 2B:
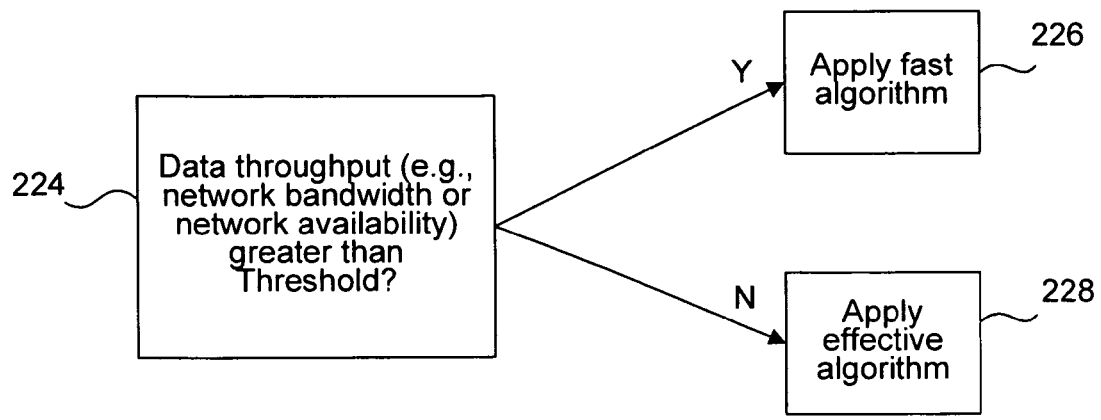
FIG. 2B is a process flow diagram illustrating a simplified method of selecting a compression algorithm to apply to an individual data segment as shown at block 202 of FIG. 2A and block 130 of FIG. 1B in accordance with one embodiment of the invention.

FIG. 2B is a process flow diagram illustrating a simplified method of selecting a compression algorithm to apply to an individual data segment as shown at block 202 of FIG. 2A and block 130 of FIG. 1B in accordance with one embodiment of the invention. In this example, since the target is an output medium such as a network interface or storage medium, the compression algorithm is selected based upon actual, dynamic data throughput and/or theoretical, static data throughput (e.g., potential capacity). For instance, when the output medium is a network interface, the actual data throughput is the network availability and the potential, theoretical data throughput is the network bandwidth. For other output mediums such as storage mediums (e.g., disk or tape), the data throughput is the rate at which the output medium can receive data. The data throughput is typically specified for such output mediums or, alternatively, may be ascertained dynamically.

In this example, if the network bandwidth and/or network availability is greater than a desired threshold at 224, a faster algorithm may be applied so that the available bandwidth may be utilized. Such faster algorithms often compromise the degree of compression that is performed. If the network bandwidth and/or network availability is not greater than the desired threshold, there is no advantage to compressing with a faster algorithm if there is not sufficient bandwidth to transmit the compressed data. Thus, in these situations, an "effective" algorithm may be used to compress the data segment at 228. For instance, the algorithm may provide a satisfactory speed of compression while compressing a data segment a moderate amount.

Figure 3A:
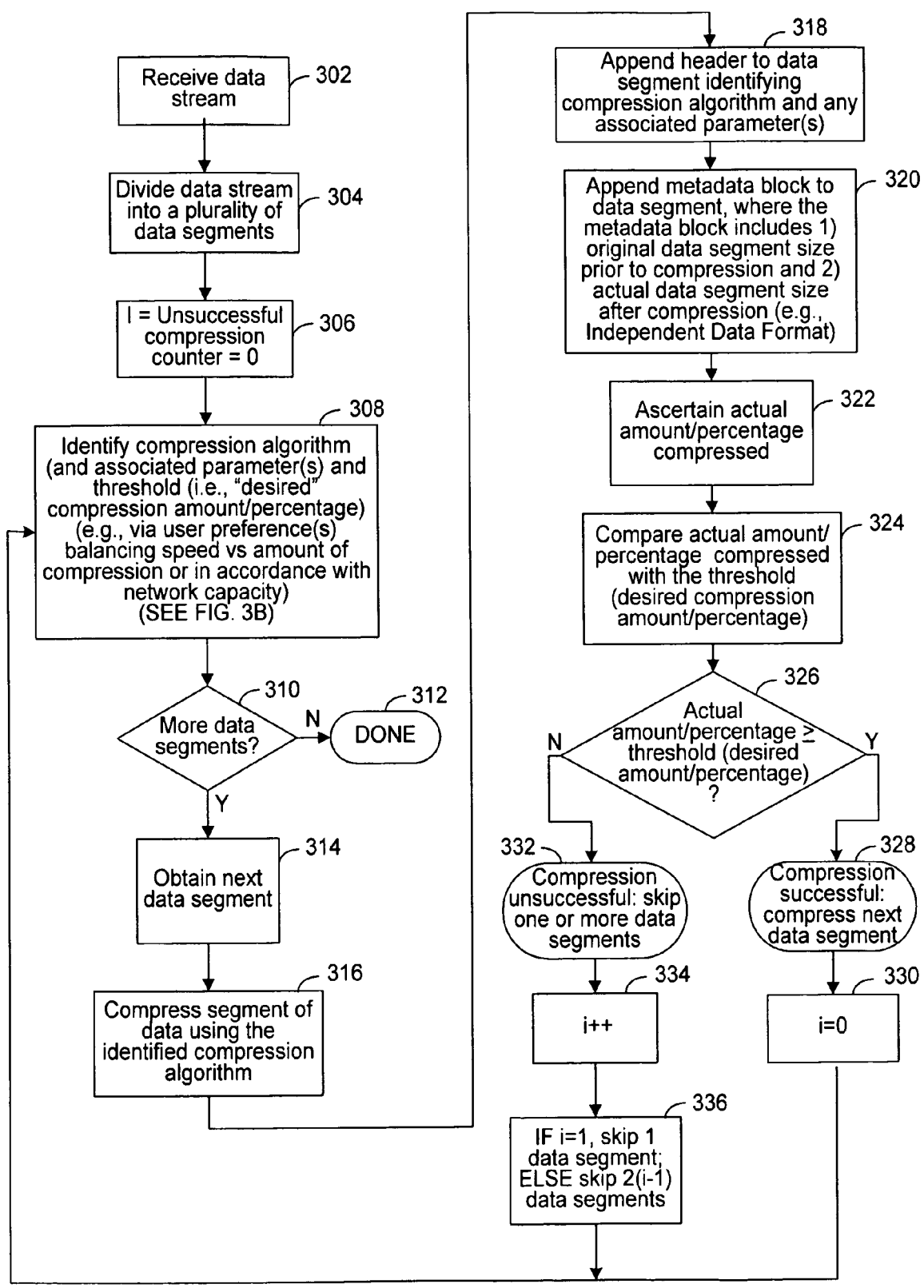
FIG. 3A is a process flow diagram illustrating an exemplary method of determining whether compression should be applied to one or more segment(s) of a data stream as shown at block 130 of FIG. 1B in accordance with the method of FIG. 2A.
Figure 3B:
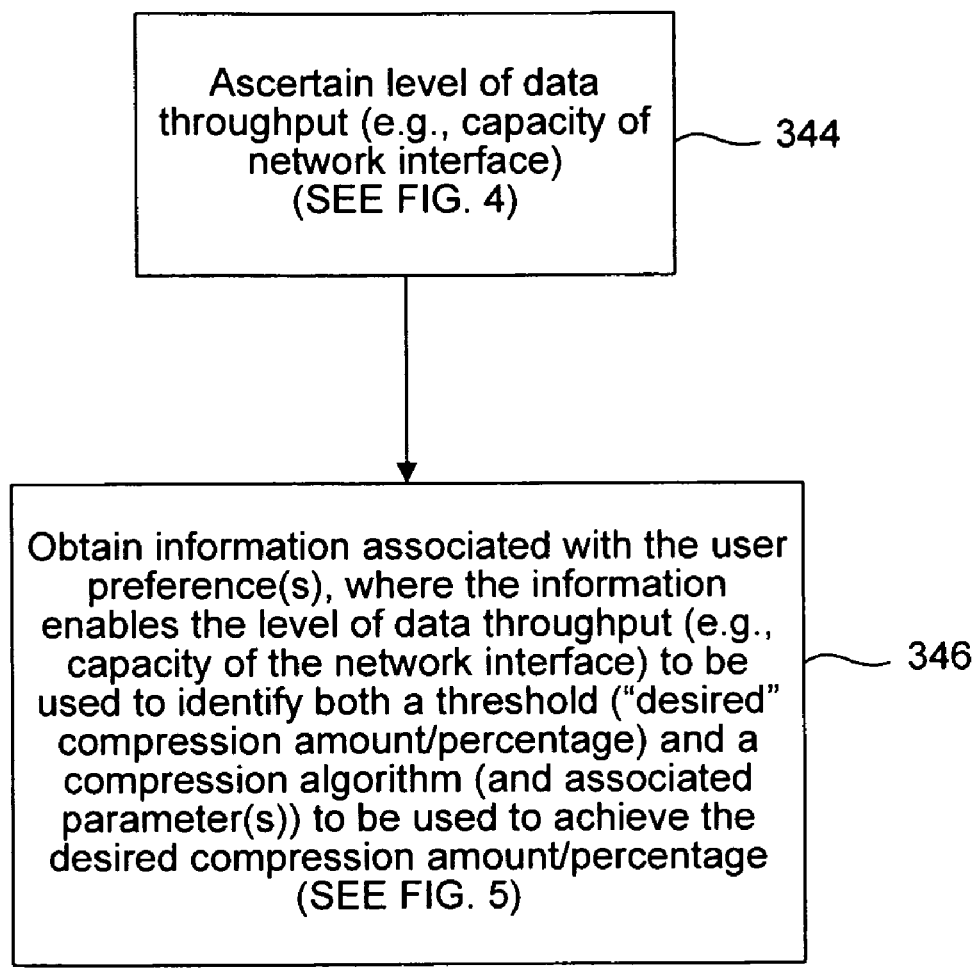
FIG. 3B is a process flow diagram illustrating a method of identifying a compression algorithm to be used to compress a segment of a data stream and a threshold (e.g., desired compression amount/percentage) as shown at block 308 of FIG. 3A in accordance with one embodiment of the invention.

The simplified diagrams presented in FIGS. 2a and 2b represent the two processes that may be performed by an adaptive compression method. In order to implement these processes, each data segment of a data stream must be individually processed. FIGS. 3a and 3b together illustrate an exemplary method of performing adaptive compression for each data segment in a data stream in accordance with one embodiment of the invention.

FIG. 3A is a process flow diagram illustrating an exemplary method of determining whether compression should be applied to one or more segment(s) of a data stream as shown at block 130 of FIG. 1B in accordance with the method of FIG. 2A. More particularly, compression is applied to a data segment based upon whether compression of at least one prior segment meets a particular threshold (e.g., desired compression amount). When a data stream is received at 302, the data stream is divided into a plurality of data segments at 304. An unsuccessful compression counter I is initialized to zero at 306, indicating that no data segments have been unsuccessfully compressed. The unsuccessful compression counter I is incremented for each data segment that does not compress successfully. In accordance with one embodiment, the counter I is incremented for successive unsuccessful compressions, and is initialized to zero when a data segment has been compressed successfully.

In order to compress a data segment, a compression algorithm to be applied is identified. This compression algorithm may be statically or dynamically selected. Moreover, the compression algorithm (and associated parameter(s)) may be selected based upon a variety of factors, including but not limited to, CPU speed, CPU availability, data throughput (e.g., network bandwidth or network availability), and/or user preferences. The desired threshold may also be established statically or dynamically based upon such factors. In accordance with one embodiment, the compression algorithm and threshold are simultaneously established based upon the same set of factors at 308. For instance, the compression algorithm and threshold may be selected based upon the network bandwidth or network availability (where the data is to be transmitted via a network connection) and a set of user preferences indicating a preference between compression speed and compression amount. One method for selecting a compression algorithm and threshold will be described in further detail below with reference to FIG. 3B.

If there are no additional data segments to process at 310, the process ends at 312. For all remaining data segments, the process continues at 314 and the next data segment is obtained. The segment of data is then compressed using the identified compression algorithm at 316.

In order to enable the compressed data segment to be subsequently decompressed, a header may be appended to the compressed data block at 318 that identifies or otherwise indicates the compression algorithm and any associated parameter(s) that have been used to compress the data segment. In addition, a metadata block (e.g., header) may be appended to the compressed data segment at 320, where the metadata block indicates the original size (e.g., number of bytes) of the data segment prior to compression and the size of the data segment after compression. In accordance with one embodiment, the compressed data segment is formatted in accordance with the System Independent Data Format.

As set forth above, a desired threshold has been statically or dynamically established or selected. In order to determine whether the amount that the data segment has been compressed meets the desired threshold amount, the actual amount (e.g., percentage) that the data segment has been compressed is ascertained at 322. This may be accomplished by comparing the size of the compressed data segment with the size of the data segment prior to compression. In this manner, the amount that the data segment has been compressed (e.g., the amount that the size of the data segment has been reduced) may be ascertained.

The actual amount that the data segment has been compressed is then compared to the desired threshold amount at 324. If the actual amount that the data segment has been compressed meets or exceeds the desired threshold at 326, the compression is successful as shown at 328. The next data segment may therefore be compressed. In other words, no data segments are skipped. In addition, the unsuccessful compression counter I is initialized to zero at 330.

If the actual amount that the data segment has been compressed does not meet or exceed the desired threshold at 326, the compression is unsuccessful as shown at 332. Since the compression has been unsuccessful, one or more data segments are skipped before compression is attempted on any further data segments. The unsuccessful compression counter I is incremented at 334. In accordance with one embodiment, the number of data segments to be skipped is determined by the number of unsuccessful consecutive compressions as indicated by the unsuccessful compression counter I. Thus, as shown at 336, if I is equal to one, one data segment is skipped. Otherwise, 2(I−1) data segments are skipped. In other words, $2^{(I-1)}$ segments (with a minimum of 1 segment) are skipped. The process then continues at 308 to compress the next data segment (if present) in accordance with an identified compression algorithm.

In accordance with one embodiment, data segments within a file or data stream are processed using parallel processing. Since data segments will not be processed consecutively, result-based processing may be performed based upon the proximity of data segments within the same file. For instance, the success or failure of the compression of a data segment (or set of data segments) may result in the decision to compress or not compress one or more data segments within a specified number of data segments of the compressed data segment. For example, the compression of the segments may be performed in parallel by two or more CPUs. The results of the compression of a segment by one CPU may be provided or made available to the other CPUs, enabling each CPU to base their decisions upon the results of all CPU activity.

In other embodiments, rather than identifying and applying a single compression algorithm, it is possible to statistically sample one or more data segments in a file using a plurality of compression algorithms on the data segments. From the statistical samples, it is possible to ascertain the best compression algorithm to apply to the particular data in those data segments.

FIG. 3B is a process flow diagram illustrating a method of identifying a threshold (e.g., desired compression amount/percentage) and a compression algorithm to be used to compress a segment of a data stream as shown at block 308 of FIG. 3A in accordance with one embodiment of the invention. Since the target may be an output medium such as a network interface or storage medium, both a threshold and compression algorithm (and any associated parameter(s)) to be applied may be identified using criteria such as the data throughput, as well as other criteria such as CPU speed, CPU availability, user preferences, and/or the length of a data segment. In this example, the data throughput such as the level of capacity (e.g., bandwidth) of the network (e.g., the capacity of a network interface) via which the compressed data is to be transmitted is ascertained at 344. The output medium may have an associated data throughput (i.e., rate at which the medium can receive data). Alternatively, the data throughput such as the network availability may be ascertained dynamically. One method of ascertaining the availability of a network interface will be described in further detail below with reference to FIG. 4. If user preferences have been obtained, these user preferences may be used to obtain information (e.g., in the form of a table) at 346 that enables the data throughput or level of capacity of the network (e.g., network interface to be used) to both identify a threshold ("desired" compression amount/percentage) and a compression algorithm (and associated parameter(s)) to be used to achieve the desired compression amount (e.g., percentage). An exemplary table that enables the data throughput or level of capacity of a network interface to be used to both identify a threshold and compression algorithm will be described in further detail below with reference to FIG. 5.

Figure 4:
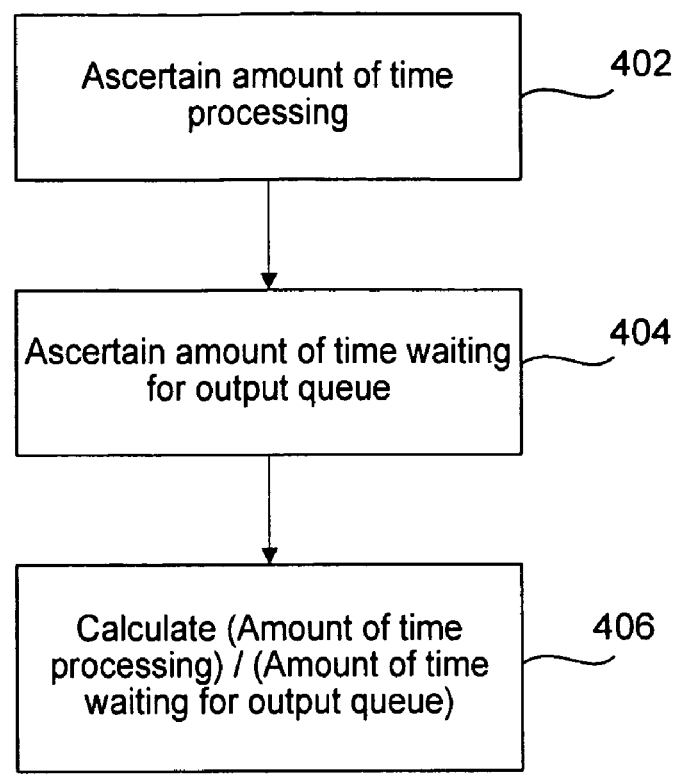
FIG. 4 is a process flow diagram illustrating a method of ascertaining the level of capacity of the network in accordance with one embodiment of the invention.

As described above with reference to block 344 of FIG. 3B, the level of capacity of a network is ascertained when the data is to be transmitted across the network. More particularly, the availability of network bandwidth may be continuously checked (e.g., according to predetermined time settings). FIG. 4 is a process flow diagram illustrating a method of ascertaining the level of capacity of the network in accordance with one embodiment of the invention. As shown at 402, the total amount of time that one or more data segments are processed (e.g., compressed) is ascertained. In addition, the total amount of time that is spent waiting to transmit data via a network connection is ascertained at 404. For instance, where an outbound queue is implemented, the total amount of time spent waiting until outbound data can be stored in the outbound queue may be ascertained. The total amount of time processing the data segment(s) may then be compared to the time spent waiting for the outbound queue. Alternatively, the amount of processing time may be divided by the total amount of time waiting for the outbound queue at 406. Similar calculations may be performed to ascertain the data throughput for other output media, such as disks or tapes.

Other methods may also be applied to ascertain the availability of network bandwidth. For instance, an outbound queue may be monitored to identify the availability of buffer space in the outbound queue. This may be accomplished by determining whether the available buffer space is less than a threshold percentage of the available buffer space.

In order to enable a compression algorithm and/or threshold associated with a particular data throughput or network capacity to be selected, a data structure is statically configured for this purpose. As described above with reference to block 346 of FIG. 3B, a table may be used to identify a compression algorithm and/or threshold associated with a particular data throughput or level of network capacity. FIG. 5 is an exemplary table that may be used to identify a compression algorithm and threshold associated with a particular data throughput or level of network capacity. As shown in FIG. 5, the data throughput/level of network capacity 502 may be used as an index to the table 500, enabling a threshold 504 and compression algorithm 506 (and any associated parameters) to be ascertained. The data throughput/level of network capacity 502 may indicate an amount of congestion in the output medium or network. The higher the data throughput or the more network bandwidth available, the less aggressive the compression method becomes in applying compression to individual segments of data. This is done by using algorithms known to be faster performing, but usually less effective in shrinking data segments. When the data throughput decreases or the network bandwidth becomes congested, the method will apply a compression algorithm known to be more effective at shrinking data segments to optimize the use of the limited network resource.

For example, a network capacity of zero may indicate that the network is greatly congested, resulting in a compression algorithm 506 (and associated parameter(s)) that will achieve the maximum amount of compression that is possible, while a network capacity of 70 may indicate that the network is only mildly congested, resulting in a compression algorithm 506 (and associated parameter(s)) that will achieve a moderate amount of compression. Thus, as the level of network capacity decreases, the amount that a data segment is to be compressed is increased via a suitable compression algorithm (and any associated parameter(s)). For instance, the ZLIB compression algorithm provides a greater degree of compression with a parameter of 9 than a parameter of 4. In this example, the threshold 504 (e.g., desired amount of compression) is represented by a desired compression percentage. For instance, the threshold of 80% compression represents a higher threshold (and higher desired compression percentage) than the threshold of 20% compression.

In accordance with one embodiment, a plurality of tables such as that illustrated in FIG. 5 are statically defined, where each of the tables is associated with a different set of user preferences. When a set of user preferences is obtained, the appropriate table is selected. From this table, the compression algorithm and/or threshold associated with a particular data throughput (e.g., network bandwidth or network availability) may be identified.

The set of user preferences may indicate a preference of the user between the speed of compression and the amount that the data is to be compressed. For instance, the set of user preferences may indicate a desired speed of compression, a desired compression amount, and/or an indication of the importance of the speed of compression vs the amount of compression to the user. For instance, the user may enter or select a weighting factor, or other option that may be used to indicate such preferences.

Moreover, the set of user preferences may reflect further goals of the user. For instance, the set of user preferences may indicate a desired speed of decompression and/or an indication of the importance of the speed of decompression vs the amount of compression to the user. The user may also indicate a preference as to the amount of storage space the user is willing to sacrifice to increase data throughput.

Figure 6:
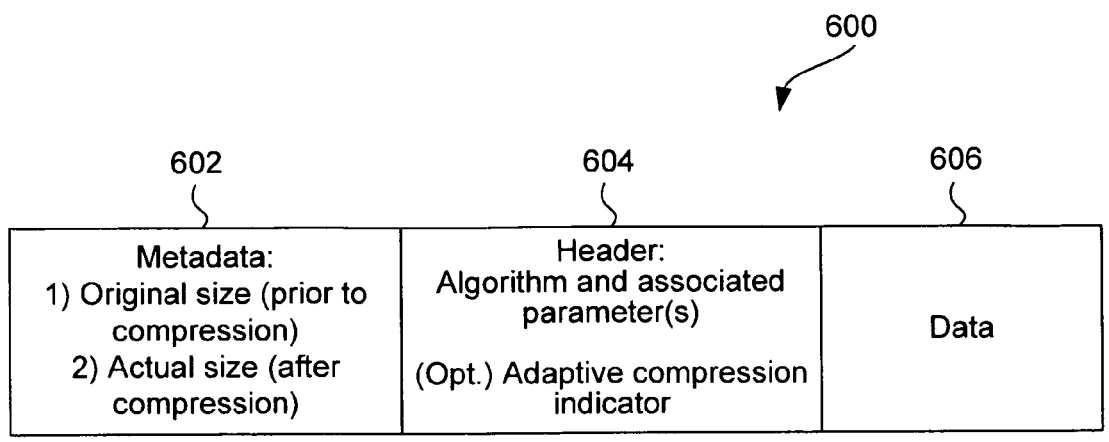
FIG. 6 is an exemplary data segment that may be generated once a data segment has been compressed.

Once a compression algorithm and any associated parameter(s) are identified, a data segment may be compressed. Upon compression of a data segment, information may be provided in any header(s) or metadata segment(s) to identify the compression algorithm and any associated parameter(s) that have been applied. In addition, it may be desirable to indicate whether the data segment has been compressed in such a header or metadata segment. FIG. 6 is an exemplary data segment 600 that may be generated once a data segment has been compressed. As shown in FIG. 6, the data segment 600 may include a metadata segment 602 (or header) that indicates the original size of the data segment prior to compression, as well as the size of the data segment after compression of the data segment. If the original size of the data segment differs from the size of the data segment after compression of the data segment, the data segment has been compressed. The compressed data segment 600 may also include a header 604 that indicates or otherwise identifies the compression algorithm and any associated parameter(s), if any, that have been applied to compress the data segment. It may also be desirable to indicate in the header 604 that adaptive compression (or a particular type of adaptive compression) has been applied via an adaptive compression indicator. The payload of the data segment 600 includes compressed (or uncompressed) data 606. Using the information provided in the header 604, the compressed data 606 may be de-compressed if the information in the metadata segment 602 indicates that the data has, in fact, been compressed.

Figure 7:
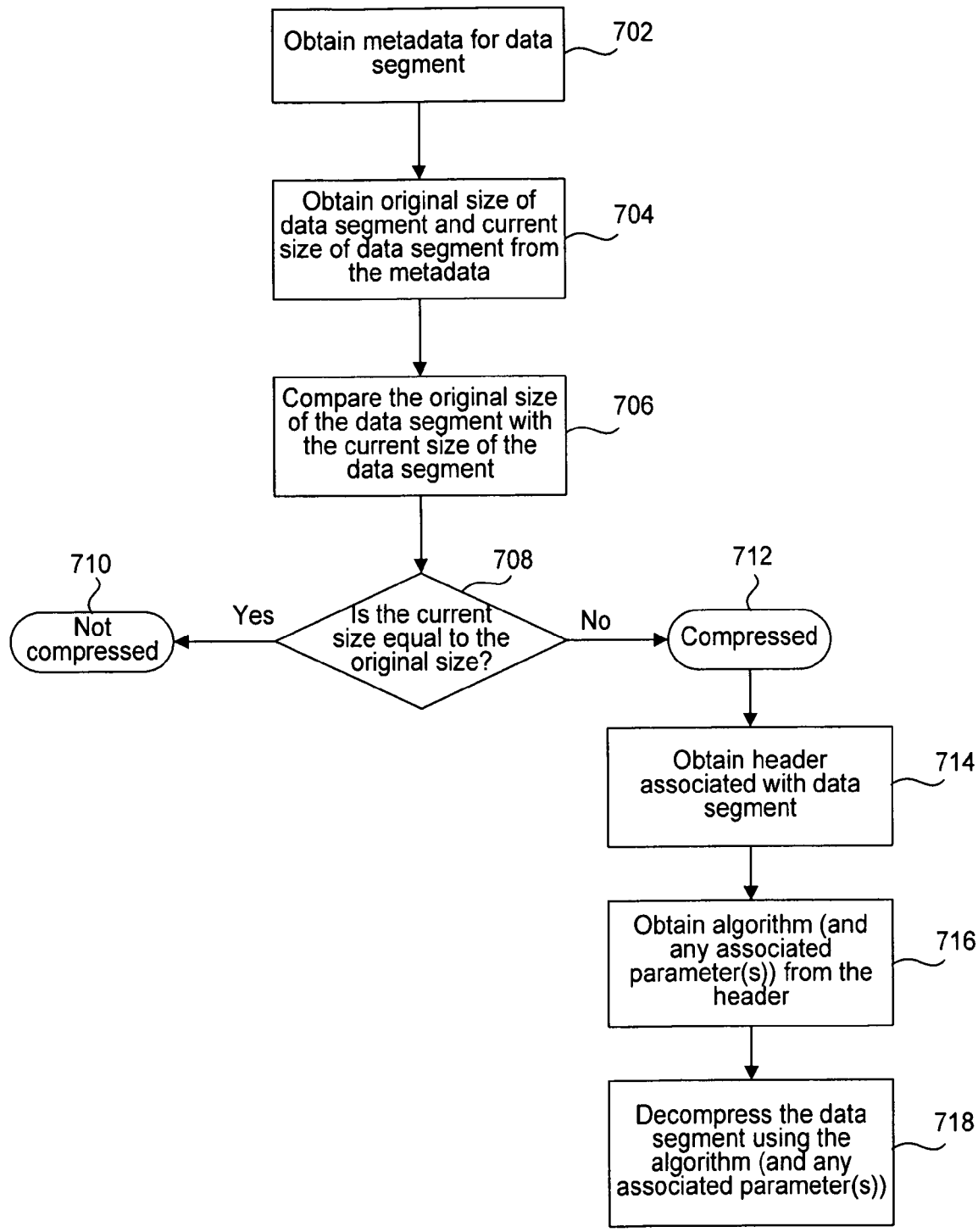
FIG. 7 is a process flow diagram illustrating a method of decompressing a compressed data segment such as that shown in FIG. 6 in accordance with one embodiment of the invention.

Once a data segment has been compressed, information provided in any header(s) or metadata segment(s) may be obtained to ascertain whether a data block has been compressed, as well as used to de-compress the compressed data segment. FIG. 7 is a process flow diagram illustrating a method of decompressing a compressed data segment such as that shown in FIG. 6 in accordance with one embodiment of the invention. As shown at 702, the metadata segment of the compressed data segment is obtained. The original size of the data segment prior to compression and the size of the data segment after compression are obtained at 704 from the metadata segment. The original size of the data segment is compared to the post-compression size of the data segment at 706. If the current size of the data segment is equal to the size of the data segment prior to compression at 708, the data segment has not been compressed as shown at 710, and therefore no de-compression is necessary. However, if the current size of the data segment is not equal to (e.g., is less than) the size of the data segment prior to compression, the data segment has been compressed as shown at 712.

If the data segment has been compressed, the compression algorithm and any associated parameter(s) are identified so that the compressed data segment may be de-compressed. As shown in this example, the header is obtained from the compressed data segment at 714 and the algorithm and associated parameter(s) are identified from the header at 716. The data segment is then de-compressed at 718 using the algorithm and associated parameter(s).

It is important to note that in addition to the factors set forth above, there may be other factors that may be pertinent to the type of compression algorithm (and parameter(s)) that may be applied and/or the threshold that may be applicable for the type of compression algorithm (and parameter(s)). Thus, the factors set forth above are illustrative, and not limited to those set forth in the above examples.

Generally, the techniques of the present invention may be implemented on software and/or hardware. In a specific embodiment of this invention, the technique of the present invention is implemented in software. Thus, the present invention relates to machine-readable media that include program instructions, state information (e.g., tables), etc. for performing various operations described herein. Examples of machine-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). The invention may also be embodied in or associated with a tangible computer-readable medium in which a carrier wave travels over an appropriate medium such as airwaves, optical lines, electric lines, etc. Examples of program instructions include both machine code, such as produced by a compiler, and files containing higher level code that may be executed by a computer using an interpreter.

Figure 8:
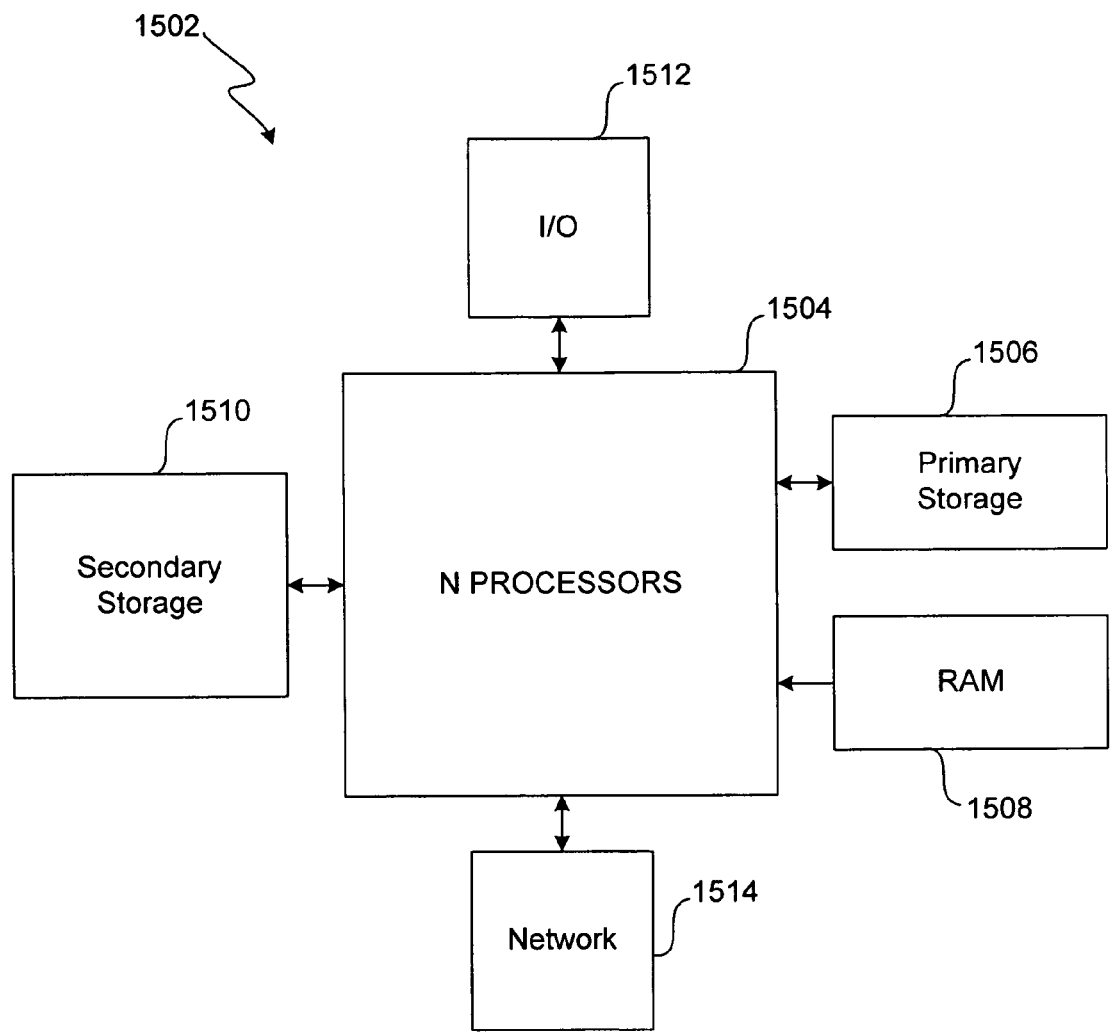
FIG. 8 is a block diagram illustrating a typical, general-purpose computer system suitable for implementing the present invention.

The present invention may be implemented on any suitable computer system. FIG. 8 illustrates a typical, general-purpose computer system 1502 suitable for implementing the present invention. The computer system may take any suitable form.

The computer system 1502 includes any number of processors 1504 (also referred to as central processing units, or CPUs) that may be coupled to memory devices including primary storage device 1506 (typically a read only memory, or ROM) and primary storage device 1508 (typically a random access memory, or RAM). As is well known in the art, ROM acts to transfer data and instructions uni-directionally to the CPUs 1504, while RAM is used typically to transfer data and instructions in a bi-directional manner. Both the primary storage devices 1506, 1508 may include any suitable computer-readable media.

A secondary storage medium 1510, which is typically a mass memory device, may also be coupled bi-directionally to CPUs 1504 and provides additional data storage capacity. The mass memory device 1510 is a computer-readable medium that may be used to store programs including computer code, data, and the like. Typically, the mass memory device 1510 is a storage medium such as a hard disk, which is generally slower than primary storage devices 1506, 1508. Alternatively, the mass memory device 1510 may be a storage device such as a SCSI storage device.

The CPUs 1504 optionally may be coupled to a computer or telecommunications network, e.g., an internet network or an intranet network, using a network connection as shown generally at 1514. With such a network connection, it is contemplated that the CPUs 1504 might receive information from the network (e.g., data), or might output information to the network (e.g., data that has been compressed or processed by an adaptive compression algorithm) in the course of performing the above-described method steps. Thus, data may be transmitted over a network to be processed, or to be stored to or retrieved from a remote storage device. For instance, the network may be a storage area network (SAN) such as a fibre-channel SAN. Accordingly, the invention may be installed for use across a network such as the Internet, thereby enabling data retrieval from and backup to disparate sources.

Although the foregoing invention has been described in some detail for purposes of clarity of understanding, it will be apparent that certain changes and modifications may be practiced within the scope of the appended claims. For instance, although the description refers to CPU availability, CPU speed, and data throughput (e.g., network bandwidth or network availability), other factors may also be applied in the selection of a compression algorithm. For instance, block length affects compression performance. As a result, the block length may be another factor that may be applied in the selection of a compression algorithm. Therefore, the described embodiments should be taken as illustrative and not restrictive, and the invention should not be limited to the details given herein but should be defined by the following claims and their full scope of equivalents.

What is claimed is:

1. A method of compressing a file including a plurality of data segments, comprising:
   dividing the file into a plurality of segments of data;
   compressing one of the plurality of segments of data;
   determining whether compression of the one of the plurality of segments of data was successful; and
   when the compression of the one of the plurality of segments of data was not successful, skipping one or more of the plurality of segments of data in proximity to the one of the plurality of segments of data that has been unsuccessfully compressed before applying the compressing step to another one of the plurality of segments of data.

2. The method as recited in claim 1, wherein the one or more of the plurality of segments of data are in proximity to the one of the plurality of segments of data that has been unsuccessfully compressed when the one or more of the plurality of segments of data are within a specified number of data segments of the segment of data that has been unsuccessfully compressed.

3. A method of compressing a data stream, comprising:
   dividing the data stream into a plurality of segments of data;
   compressing one of the plurality of segments of data;
   determining whether compression of the one of the plurality of segments of data was successful; and
   when the compression of the one of the plurality of segments of data was not successful, skipping one or more of the plurality of segments of data following the one of the plurality of segments of data that has been unsuccessfully compressed before applying the compressing step to another one of the plurality of segments of data.

4. The method as recited in claim 3, wherein the plurality of segments of data are variable length data segments.

5. The method as recited in claim 3, further comprising:
   when the compression of the one of the plurality of segments of data was successful, compressing a next one of the plurality of segments of data following the one of the plurality of segments of data that has been compressed.

6. The method as recited in claim 5, further comprising:
   identifying a type of compression to apply;
   wherein compressing a next one of the plurality of segments of data following the one of the plurality of segments of data that has been compressed includes applying the identified type of compression to the next one of the plurality of segments of data following the one of the plurality of segments of data that has been compressed.

7. The method as recited in claim 6, wherein identifying the type of compression to apply comprises:
   applying a plurality of types of compression to one or more of the plurality of data segments;
   determining a result of the applying the plurality of types of compression to the one or more of the plurality of data segments; and
   selecting one of the plurality of types of compression based upon the result of the applying the plurality of types of compression to the one or ore of the plurality of data segments.

8. The method as recited in claim 6, wherein the type of compression is associated with a set of user preferences.

9. The method as recited in claim 8, wherein the set of user preferences indicates at least one of a desired speed of compression, a desired compression amount, and an indication of the importance of the speed of compression with respect to the importance of the amount of compression.

10. The method as recited in claim 6, wherein the type of compression is an identified compression algorithm or indicates that no compression is to be performed.

11. The method as recited in claim 10, wherein the type of compression further includes one or more parameters associated with the identified compression algorithm.

12. The method as recited in claim 6, further comprising:
   determining at least one of a length of the data segment that has been compressed, data throughput, network bandwidth, network availability, CPU availability, and CPU speed;
   wherein identifying a type of compression to apply is performed based upon at least one of the length of the data segment that has been compressed, data throughput, network bandwidth, network availability, CPU availability, and CPU speed.

13. The method as recited in claim 12, wherein determining the network availability is performed when the data is to be transmitted via a network interface for storage at a remotely located storage medium.

14. The method as recited in claim 12, wherein the type of compression is an identified compression algorithm or indicates that no compression is to be performed.

15. The method as recited in claim 14, wherein the type of compression further includes one or more parameters associated with the identified compression algorithm.

16. The method as recited in claim 12, wherein the type of compression is further associated with a set of user preferences.

17. The method as recited in claim 16, wherein the set of user preferences indicates at least one of a desired speed of compression, a desired compression amount, and an indication of the importance of the speed of compression with respect to the importance of the amount of compression.

18. The method as recited in claim 17, wherein identifying a type of compression to apply comprises:
   obtaining a set of information associated with the set of user preferences; and
   identifying the type of compression associated with the at least one of the length of the data segment that has been compressed, data throughput, network bandwidth, network availability, CPU availability, and CPU speed from the set of information.

19. The method as recited in claim 16, wherein identifying a type of compression to apply comprises:
   obtaining a set of information associated with the set of user preferences; and
   identifying the type of compression associated with the at least one of the length of the data segment that has been compressed, data throughput, network bandwidth, network availability, CPU availability, and CPU speed from the set of information.

20. The method as recited in claim 19, further comprising:
   identifying a desired compression amount from the set of information;
   determining an amount that the data segment has been compressed;
   wherein determining whether compression of the one of the plurality of data segments was successful includes comparing the desired compression amount with the amount that the data segment has been compressed.

21. The method as recited in claim 12, wherein determining the network availability comprises:
   identifying a queue of data buffers to be written to the remotely located storage medium; and
   ascertaining an availability of the data buffers.

22. The method as recited in claim 21, further comprising:
   comparing the availability of the data buffers with a desired availability.

23. The method as recited in claim 12, wherein determining the network availability comprises:
   identifying a queue of data buffers to be written to the remotely located storage medium;
   determining a processing time associated with applying the type of compression to one or more data segments; and
   ascertaining a total amount of time waiting for the queue to store the one or more data segments in the queue.

24. The method as recited in claim 23, further comprising:
   calculating an efficiency of compression equal to the processing time divided by the total amount of time waiting for the queue.

25. The method as recited in claim 3, further comprising:
   tracking a number of the plurality of segments of data (n) that have not compressed successfully;
   wherein skipping one or more of the plurality of segments of data includes skipping (n*2) of the plurality of segments of data before compressing another one of the plurality of segments of data.

26. The method as recited in claim 25, wherein the number of the plurality of segments of data (n) that have not compressed successfully is a number of consecutive segments of data that have not compressed successfully.

27. The method as recited in claim 3, further comprising:
   tracking a number of the plurality of segments of data (n) that have not compressed successfully;
   wherein skipping one or more of the plurality of segments of data includes skipping one of the plurality of segments of data when n is equal to one and skipping 2(n−1) of the plurality of segments of data when n is greater than one.

28. The method as recited in claim 27, wherein the number of the plurality of segments of data (n) that have not compressed successfully is a number of consecutive segments of data that have not compressed successfully.

29. The method as recited in claim 3, further comprising:
   identifying a desired compression amount; and
   determining an amount that the data segment has been compressed;
   wherein determining whether compression of the one of the plurality of data segments was successful includes comparing the desired compression amount with the amount that the data segment has been compressed.

30. The method as recited in claim 29, wherein compression of the one of the plurality of data segments was successful when the amount that the one or more data segments has been compressed is greater than or equal to the desired compression amount.

31. The method as recited in claim 29, wherein identifying a desired compression amount comprises:
   identifying a desired compression amount based upon at least one of data throughput, network bandwidth, network availability, CPU availability, and CPU speed.

32. The method as recited in claim 29, wherein identifying a desired compression amount comprises:
   identifying a desired compression amount based upon a set of user specified preferences.

33. The method as recited in claim 32, wherein the desired compression amount is associated with at least one of data throughput, network bandwidth, network availability, CPU availability, and CPU speed.

34. A method of identifying a type of compression to apply to one or more data segments of a data stream, comprising:
   determining at least one of data throughput, network bandwidth, network availability, CPU availability, and CPU speed;
   identifying a type of compression to apply to one or more data segments of the data stream based upon at least one of the following factors: data throughput, network bandwidth, network availability, CPU availability, and CPU speed;

applying the type of compression to one or more data segments of the data stream;

ascertaining a desired compression amount;

determining an amount that the one or more data segments has been compressed;

comparing the desired compression amount with the amount that the one or more data segments has been compressed; and determining whether to compress one or more data segments following the one or more data segments that have been compressed based upon the comparison.

35. The method as recited in claim 34, further comprising:

when the amount that the one or more data segments has been compressed is greater than the desired compression amount, compressing one or more data segments following the one or more data segments that have been compressed; and when the amount that the one or more data segments has been compressed is not greater than the desired compression amount, skipping compression of one or more data segments following the one or more data segments that have been compressed.

36. The method as recited in claim 34, wherein ascertaining a desired compression amount comprises:

identifying a desired compression amount based upon at least one of the data throughput, network bandwidth, network availability, CPU availability, and CPU speed.

37. The method as recited in claim 34, wherein ascertaining a desired compression amount comprises:

identifying a desired compression amount based upon a set of user specified preferences.

38. An apparatus for compressing a file including a plurality of data segments, comprising:

a processor; and a memory, at least one of the processor or the memory being adapted for:

dividing the file into a plurality of segments of data;

compressing one of the plurality of segments of data;

determining whether compression of the one of the plurality of segments of data was successful; and when the compression of the one of the plurality of segments of data was not successful, skipping one or more of the plurality of segments of data in proximity to the one of the plurality of segments of data that has been unsuccessfully compressed before applying the compressing step to another one of the plurality of segments of data.

39. A computer-readable medium storing thereon computer-readable instructions for compressing a file including a plurality of data segments, comprising:

instructions for dividing the file into a plurality of segments of data;

instructions for compressing one of the plurality of segments of data;

instructions for determining whether compression of the one of the plurality of segments of data was successful; and instructions for skipping one or more of the plurality of segments of data in proximity to the one of the plurality of segments of data that has been unsuccessfully compressed before applying the compressing step to another one of the plurality of segments of data when the compression of the one of the plurality of segments of data was not successful.

40. An apparatus for compressing a file including a plurality of data segments, comprising:

means for dividing the file into a plurality of segments of data;

means for compressing one of the plurality of segments of data;

means for determining whether compression of the one of the plurality of segments of data was successful; and means for skipping one or more of the plurality of segments of data in proximity to the one of the plurality of segments of data that has been unsuccessfully compressed before applying the compressing step to another one of the plurality of segments of data when the compression of the one of the plurality of segments of data was not successful.

41. An apparatus for compressing a data stream, comprising:

a processor; and a memory, at least one of the processor or the memory being adapted for:

dividing the data stream into a plurality of segments of data;

compressing one of the plurality of segments of data;

determining whether compression of the one of the plurality of segments of data was successful; and when the compression of the one of the plurality of segments of data was not successful, skipping one or more of the plurality of segments of data following the one of the plurality of segments of data that has been unsuccessfully compressed before applying the compressing step to another one of the plurality of segments of data.

42. The apparatus as recited in claim 41, wherein the plurality of segments of data are variable length data segments.

43. The apparatus as recited in claim 41, at least one of the processor or the memory being further adapted for:

when the compression of the one of the plurality of segments of data was successful, compressing a next one of the plurality of segments of data following the one of the plurality of segments of data that has been compressed.

44. An apparatus for compressing a data stream, comprising:

means for dividing the data stream into a plurality of segments of data;

means for compressing one of the plurality of segments of data;

means for determining whether compression of the one of the plurality of segments of data was successful; and means for skipping one or more of the plurality of segments of data following the one of the plurality of segments of data that has been unsuccessfully compressed before applying the compressing step to another one of the plurality of segments of data when the compression of the one of the plurality of segments of data was not successful.

* * * * *